United States Patent
Soreff et al.

(10) Patent No.: US 8,607,176 B2
(45) Date of Patent: Dec. 10, 2013

(54) DELAY MODEL CONSTRUCTION IN THE PRESENCE OF MULTIPLE INPUT SWITCHING EVENTS

(75) Inventors: Jeffrey P. Soreff, Poughkeepsie, NY (US); Bhavana Agrawal, Armonk, NY (US); David J. Hathaway, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 214 days.

(21) Appl. No.: 13/088,688

(22) Filed: Apr. 18, 2011

(65) Prior Publication Data

US 2012/0266119 A1    Oct. 18, 2012

(51) Int. Cl.
  *G06F 9/455* (2006.01)
  *G06F 17/50* (2006.01)
(52) U.S. Cl.
  USPC ............ 716/108; 716/110; 716/111; 716/134
(58) Field of Classification Search
  USPC ....................................................... 716/108
  See application file for complete search history.

(56) References Cited

U.S. PATENT DOCUMENTS 7,739,640 B2    6/2010  Abbaspour et al.
2010/0313176 A1*  12/2010  Takahashi et al. ............ 716/108

OTHER PUBLICATIONS

Sridharan, et al., "Modeling Multiple Input Switching of CMOS Gates in DSM Technology Using HDMR", Dept. of Electrical and Computer Engineering, Colorado State University, Jun. 2006.
Chandramouli, et al., "Modeling the Effects of Temporal Proximity of Input Transitions on Gate Propagation Delay and Transition Time", University of Michigan, CSE-TR-262-95, Oct. 10, 1995.
Fukuoka, et al., "Statistical Gate Delay Model for Multiple Input Switching" Kyoto University, 2008 IEEE.

* cited by examiner

*Primary Examiner* — Jack Chiang
*Assistant Examiner* — Eric Lee
(74) *Attorney, Agent, or Firm* — H. Daniel Schnurmann (57) ABSTRACT

A method for constructing delay rules which include the effects of MIS simulations for static timing analysis with reduced cost. The present method includes constructing skew windows for applying MIS penalties purely from SIS data, and scales the MIS penalties during rule use based upon how closely the skews in the use case approach the edge of the skew window. The method applies both to timing rule construction for a library of circuits and to timing rule construction for macros where only part of the circuits in the macro may be sensitive to skew between macro inputs.

20 Claims, 12 Drawing Sheets

DELAY MODEL CONSTRUCTION IN THE PRESENCE OF MULTIPLE INPUT SWITCHING EVENTS

FIELD OF THE INVENTION

The present invention relates to the field of Electronic Design Automation, and, more particularly, to a method and a system for constructing a delay model from a digital transistor circuit for a static timing analysis using circuit simulation.

BACKGROUND

For many years, the performance of digital machine designs has been evaluated by performing static timing analysis on the designs. Timing analysis is a design automation tool which provides an alternative to the hardware debugging of timing problems. The program is intended to establish whether all the paths within the design meet stated predetermined timing criteria, i.e., whether data signals arrive at storage elements early enough for a valid capture, but not so early as to cause premature capture.

Propagation Segments, Timing Points, and Timing Graph:

Static timing analysis (STA) of digital systems has been used for decades to analyze the performance of digital designs. When performing an STA, elements of the design which can delay signals, such as logic gates, wires, and combinations thereof, are represented by propagation segments, also referred to as 'psegs', and which represent the delays of the elements. Known in the art are systems where delays are determined by circuit simulations, as well as systems where delays are computed by various approximations to a simulated result. Each pseg includes two timing points, a "from" timing point representing an input to the delay element and a "to" timing point representing an output of the delay element. The timing graph of the design as a whole includes a full set of all the timing points and psegs of all logic gates, interconnect wires, and like delay elements in the design.

Delay Models, Delay Model Construction:

For large hardware designs, static timing analysis is preferably done hierarchically. In a hierarchical static timing analysis, the STA is performed by generating abstracted timing models for each subsection of the design, starting at the lowest level with the logic macros. An abstracted timing model is a representation of the effect of a subsection of the design on the timing analysis of the design as a whole. For example, it may consist of a subset of the psegs copied from the timing graph of that subsection, typically omitting psegs which purely affect the internal timing of that subsection. The models are then combined into successively higher level timing analyses and abstracted timing models until the analysis of the entire system is complete. This is necessary in order to keep the memory requirements of the analysis affordable. Hierarchical static timing analysis requires that delay models be generated for lower level subsections of the design in order to use them for performing the static timing analysis of larger sections of the design that contains them. A delay model represents the delay through a circuit topologically with psegs, but unlike the STA of a lowest level section of a design, the delay model calculates the delay through a pseg without circuit simulations at the time that the delay model is used. Instead, a delay model calculates delays based on stored information from circuit simulations which were done when the delay model was being constructed.

Delay Sampling:

When the delay model is being constructed for a subsection of a design, various parameters affecting the delays through the subsection in the complete design are generally not known. For instance, the input slew (a measure of the time it takes for the input to transition) and output load for a subsection of a design are generally unknown at the time when the delay model is constructed. This is generally handled by sampling the variation of delay with respect to these parameters, varying these parameters through a number of values, performing a circuit simulation for each combination, and capturing the delay in the model.

Single Input Switching, Multiple Input Switching, Input Skew, MIS Penalty:

In the simplest form of STA, only the input at the "from" end of a pseg switches in any given circuit simulation. In this form, any other inputs are held at constant logical values. For example, a NOR gate with two inputs A and B, and with an output Z will be simulated with input A rising while input B is held at zero to produce one of the delays from A to Z on the pseg from A to Z. This is referred to as a single input switching (SIS) event or simulation. More sophisticated analyses also includes simulations where more than one input switches. For example, if two inputs to a NOR gate rise, the output also falls, but with a different delay than if a single input switches. This is referred to as a multiple input switching (MIS) event or simulation. The value of the delay from the simulation depends upon the relative timing between the two switching inputs, the skew therebetween is illustrated with reference to FIGS. 1a and 1b. The delay model for a subsection of the design must report the worst possible delay for each pseg. Adding information about MIS simulations, in addition to the information about the SIS simulations, makes the delays worse. This is the MIS penalty for a pseg (see FIGS. 1c and 1d). In other words, the MIS penalty is the difference between the worst possible pseg delay, including both MIS and SIS simulation results, and the worst delay when only the SIS results are included. Static timing analysis typically is used to find both maximum (late mode) and minimum (early mode) arrival times. The MIS penalty may be either positive (increasing the SIS delay) or negative (decreasing the SIS delay), and a positive MIS penalty would preferably be used only for late mode analysis, while a negative delay would preferably be used only for early mode analysis. A delay change due to MIS typically occurs because multiple transistors within a gate, or CCC (channel connected component) can contribute to an output transition. Multiple input switching on inputs connected to gates of transistors driving an output through a series path, such as the PFETs in the NOR gate of FIG. 1a will typically cause a positive MIS penalty. Multiple input switching on inputs connected to gates of transistors driving an output through parallel paths, such as the NFETs in the NOR gate of FIG. 1a will typically cause a negative MIS penalty. The example of FIGS. 1a-d illustrates a falling output transition driven by one or both of the parallel NFETs, and a resulting negative MIS penalty.

Figure 1A:
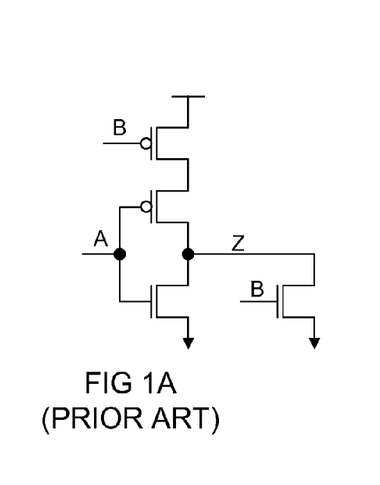
FIGS. 1a-1d illustrate a prior art MIS simulation and its dependence on input skew.
Figure 1B:
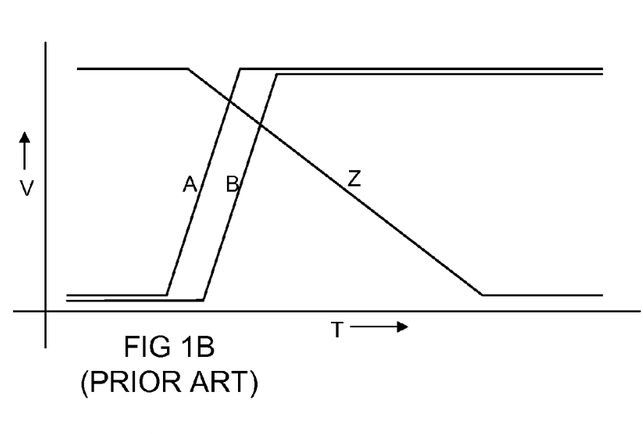
Figure 1C:
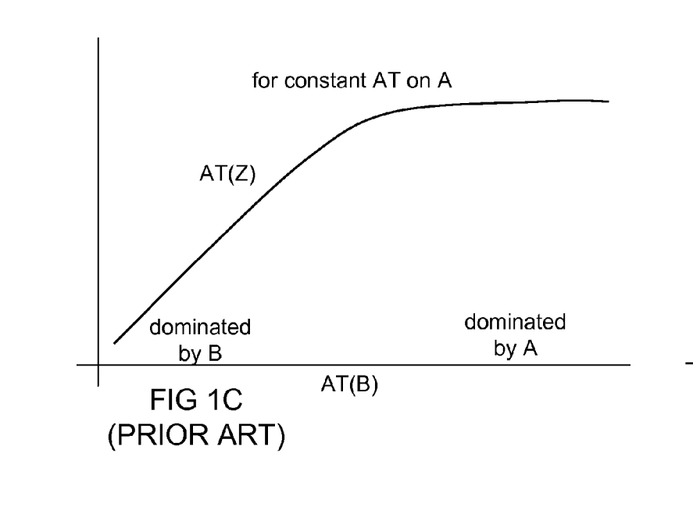
Figure 1D:
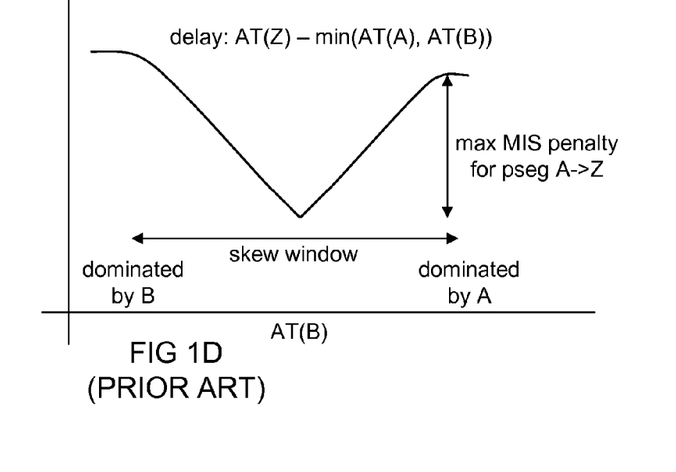

MIS Window:

MIS simulations include switching events on a number of circuit inputs, separated by the skews between the input switching events. If the skews become sufficiently large, the circuit has time to settle between each successive input switch. In this limit, the circuit is essentially responding to a sequence of SIS events, and the MIS penalty no longer applies. This occurs when the skew between any two inputs becomes sufficiently large in either a positive or negative direction. Thus, there is a window of skew within which the MIS penalty applies, as illustrated in FIG. 1d.

Figure 2:
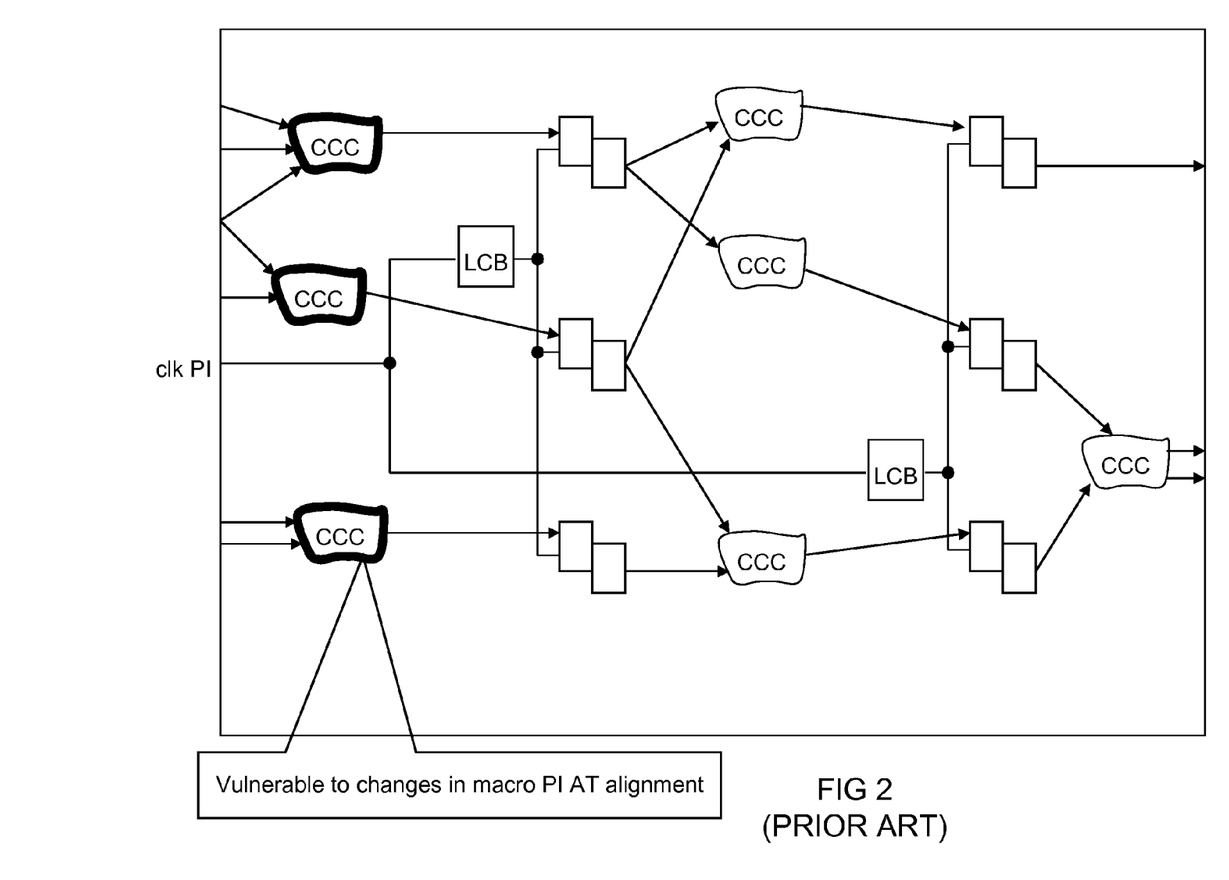
FIG. 2 illustrates a portion of a prior art macro which is sensitive to skews between macro inputs.
Figure 3:
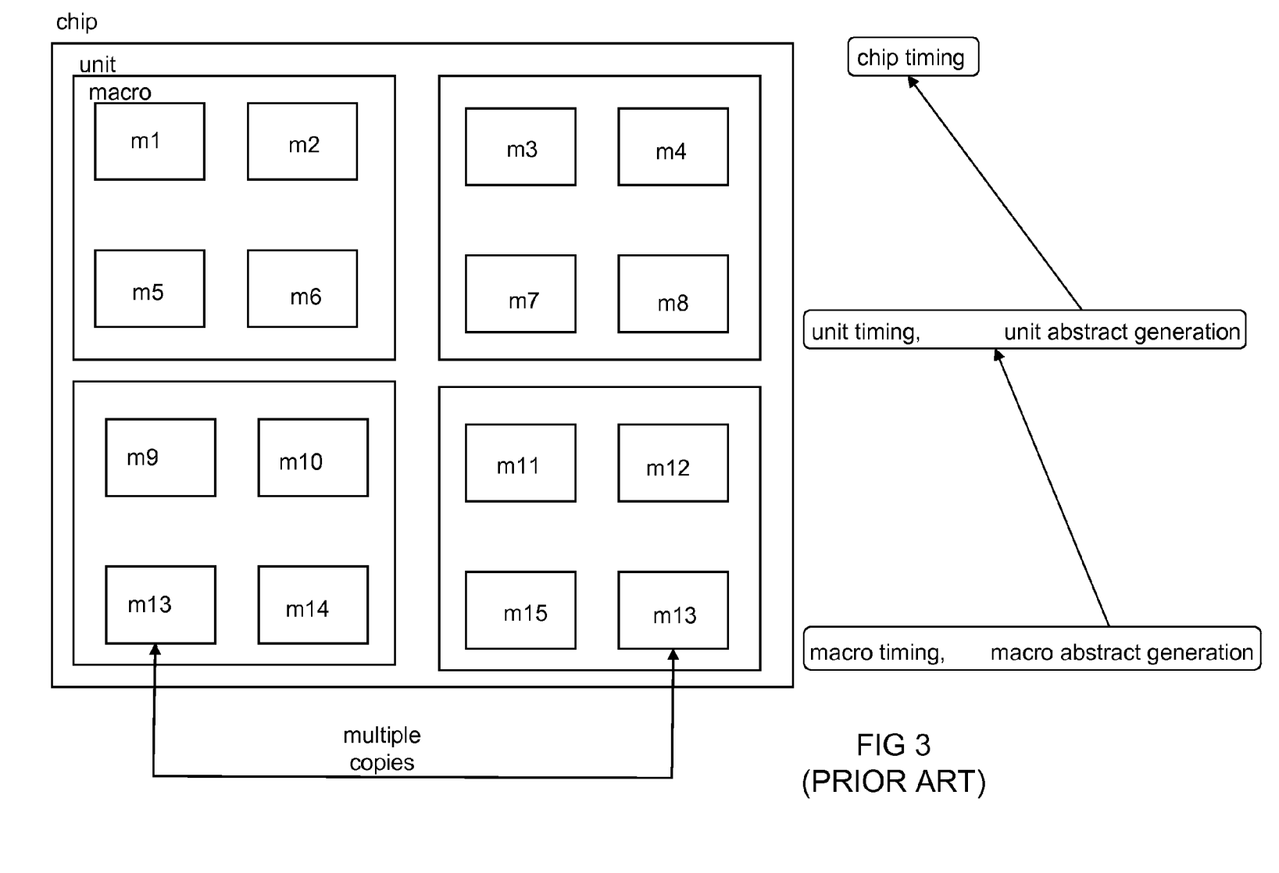
FIG. 3 shows multiple copies of a prior art macro in a design.

MIS simulations create skew dependence problems for delay model generation in certain portions of a macro. In the portion of the macro from the PIs (primary inputs) to the data inputs of the first level of non-transparent latches or flip-flops (represented by paired boxes), the skew between inputs to each CCC typically depends on the skew, as seen in FIG. 2, between the macro PIs, which is not normally known when the abstracted timing rule is being generated. Even more seriously, since some macros are used in multiple places within an overall design, and multiple usages may have different skews between their PIs' arrival times (ATs), the skew cannot be uniquely specified when the abstract is generated, as illustrated in FIG. 3. Delay models for individual gates are also typically reused for many different instances of a gate within a design with different skews between the ATs of the gate inputs, and thus the MIS penalty will differ between different instances of the gate and cannot be determined at model generation time.

Figure 4:
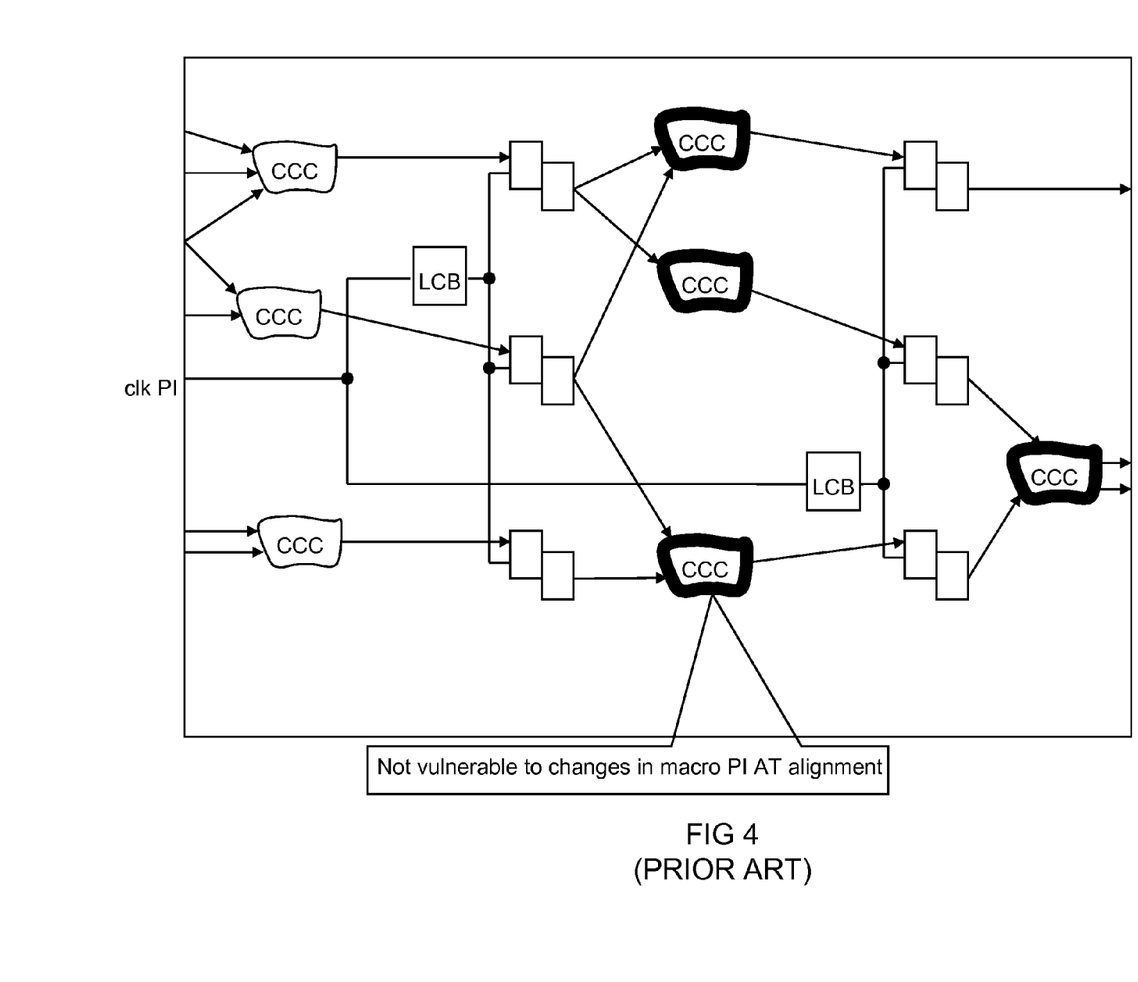
FIG. 4 shows a portion of a prior art macro which is not sensitive to skews between the macro inputs.

There are other portions of a macro, latch to latch and latch to output paths, paths beyond the first level of non-transparent latches, where relative skew can be determined safely when the abstract is generated. In these areas, all CCC primary input arrival times are traceable directly or through LCBs (local clock buffers) to the macro clock PI such that the relative skew is fixed, and this relative skew can be applied as a known quantity in the simulation of each CCC in these portions of the macro, as illustrated in FIG. 4. In some cases macros may have multiple clock inputs, and if the skews between these clock inputs can vary or is not known at model generation time, the input AT skews for CCCs driven by latches controlled by different input clocks and the resultant MIS penalties will also be unknown at model generation time.

More generally, any non-transparent or edge-triggered logic structure (such as some domino circuits, if modeled non-transparently) can also bound the portion of the macro affected by macro PIs' ATs' skew. Any CCC whose input ATs are determined by the AT of a single PI (data or clock) will have a fixed skew which can be applied as a known quantity during delay model generation.

Figure 5:
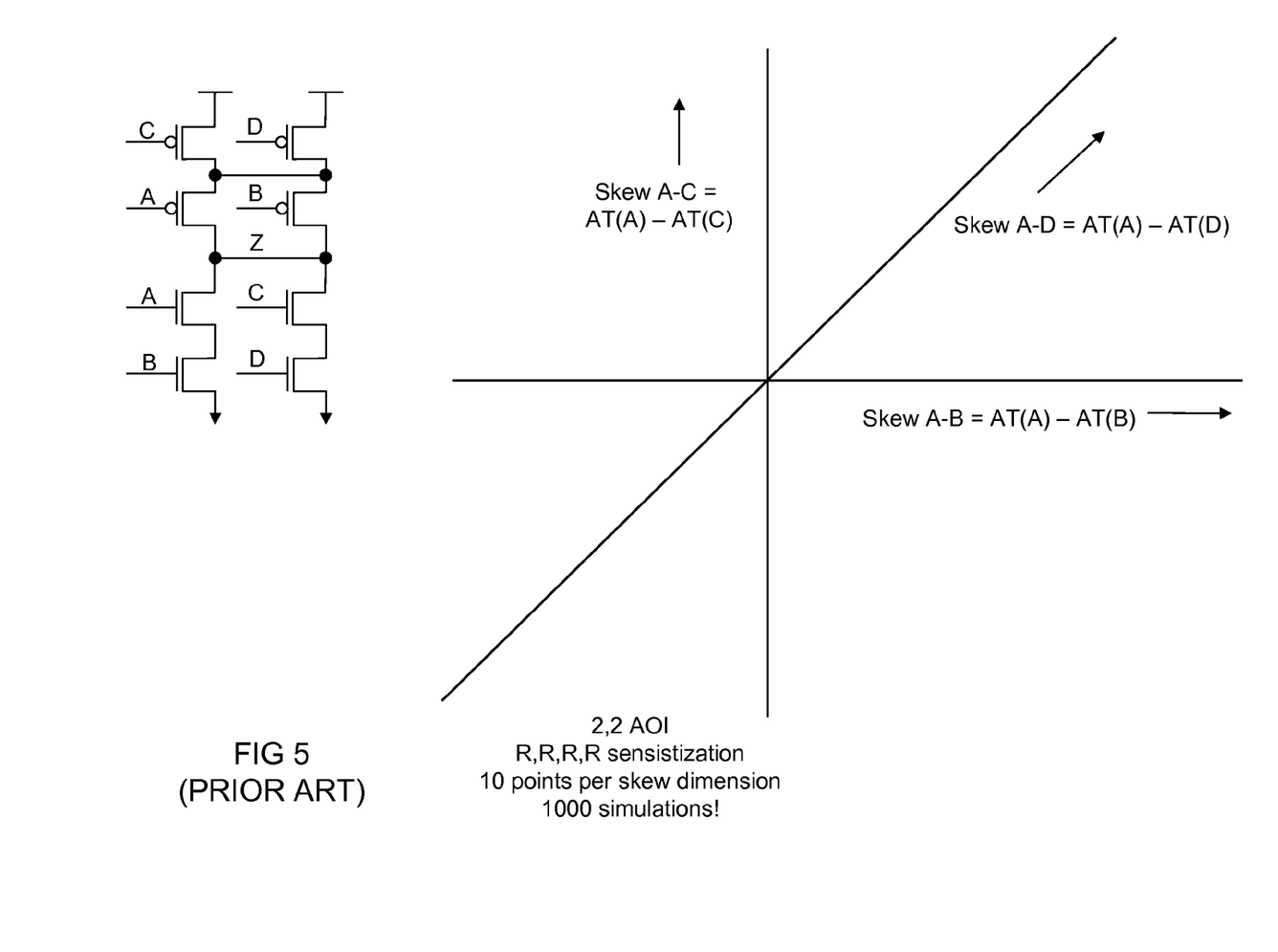
FIG. 5 illustrates some consequences associated with a prior art full sampling of a skew variation.

Capturing delays due to MIS simulations where the skews cannot be predetermined poses a problem for the delay model construction. Because these delays are sensitive to the skew between inputs, for maximum accuracy, one may like to sample various combinations of these skews as one does for the other parameters that the delay depends on. The difficulty is that the number of samples needed grows exponentially with the number of inputs (see FIG. 5). This greatly increases the cost of constructing the delay model. The prior art includes a number of approaches:

i) Creating a delay model based on single input switching delays and ignoring MIS or adding an averaged penalty factor. This has the advantage of avoiding the cost of any multiple input switching simulations during abstract rule generation. This has the disadvantage of approximating the MIS effects with a global average insensitive to the magnitude of the effect on each specific circuit.

ii) Creating a delay model by explicitly sampling the possible skews that might feed into each CCC, performing each of these simulations during abstract generation, and capturing the resulting delays as a table for interpolation during delay model use. For a sensitization with N inputs switching there are N−1 relative skews to be sampled (ignoring differences in slews on the inputs), so this expands the space to be sampled during abstract generation by N−1 dimensions. For example, creating a delay model for a 4-input NAND while accounting for only SIS simulations requires a delay rule which depends upon input slew and output load, 2-dimensions. In contrast, creating a rule which also accounts for MIS simulations requires a delay rule which depends upon input slew, output load, the skew between input 1 and input 2, the skew between input 2 and input 3, and the skew between input 3 and input 4, a total of five dimensions which must be sampled, for an addition of three extra dimensions in addition to those needed for the SIS rule. This has the advantage of capturing the full skew dependence, but the disadvantage of very high simulation costs during abstract generation and very high model size, as both the number of simulations and the size of the resulting data table grow exponentially with the number of dimensions. For K sampling points in each of D dimensions, the number of required simulations and table entries is $K^D$.

iii) Similar to (ii), but fitting the delay model to a linear or other functional form within a window. This has the advantage of capturing most of the dependence on macro PI AT skew for use in the upper level timing analysis and reducing the size of the resulting delay model, but retains the disadvantage of performing many simulations to sample possible skews between inputs.

iv) Creating a delay model with a single simulation of the MIS sensitization with a worst case alignment of the side input ATs, and worst-casing the resulting delay value into the delay model for use in all higher level timing analyses. This has the advantage of confining the cost to a single simulation, but it also has the disadvantage of pessimism, applying this worst (minimum for early mode or maximum for late mode) result in the higher level analyses regardless of the macro PI AT skew. Note that because an MIS penalty is normally applied only to one of the early and late mode analyses, the SIS delay characterization is still needed for the other mode.

v) Similar to (iv) but when characterizing the delay from a particular input, allowing all other side inputs ATs to move in optimistic directions (move earlier for late mode analysis and later for early mode analysis) to reduce the penalty from the MIS simulations when determining the delay from the particular input. Typically this movement is allowed until the AT is the same as that of the particular input, or until it would (using delays from SIS modeling) cause the same AT at the output. For the input with the worst AT (maximum for late mode or minimum for early mode) the MIS penalty would be the same as for (iv). Again, this has the advantage of confining the cost to one MIS simulation per input. Although it reduces the pessimism of the abstracted rule, it also creates the possibility of optimism.

In view of the foregoing, there is a need to improve the trade-off between the cost of generating an abstracted timing rule for a logic macro from a transistor level timing which contains contributions from multiple input switching simulations and the pessimism of timing rules.

SUMMARY

The objects, aspects and advantages of the invention are achieved by a method and a system for reducing the cost of delay model construction in the presence of MIS simulations.

According to one aspect of one embodiment of the invention, the method selects the MIS skew window by calculating from the SIS delays and output slews from the psegs from each input that switches in the MIS simulation to the output of the pseg for which delay is being calculated. Thus, no MIS simulations are required for calculating the MIS skew window. Further, the MIS delay is calculated during delay model construction by performing a single simulation where the inputs are skewed in such a way that edges propagated from them meet at a common point within the circuit at the same time. Further, during use of this delay model, the MIS penalty is reduced smoothly to zero from the center of the MIS window to its edges.

In another embodiment, a MIS penalty is advantageously set to the maximum penalty for any skew within the window and eliminated completely outside the window.

In still another embodiment, the single MIS simulation aligns the switching events at the inputs to the circuit under analysis in order to compute the MIS penalty rather than propagating to a common point.

In yet another embodiment, a global scale factor is multiplied by the size of the MIS window before use, allowing an additional optimism or pessimism to be added to the delay model.

In a further embodiment, an embodiment of the inventive method is applied to just those circuits in a macro which are exposed to varying macro PI ATs, while those insulated from these ATs are simulated with the fixed skews defined by the macro internal circuitry.

In yet a further embodiment, the MIS window calculation portion of the inventive method is applied to STA of a macro, and used to skip computing the MIS simulations where the skews set by the internal circuitry of the macro fall outside of the window set by the method.

In still a further embodiment, the inventive method is applied to a library characterization, where the inputs of the individual library circuits play the same role as the macro PIs play in a more general method, and all inputs are considered to be exposed to skew variation.

In another embodiment, there is provided a method of generating a delay model for a circuit that models an effect of multiple input switch (MIS) events including a plurality of inputs of the circuit, the method including: a) using a computer, performing a single input switch (SIS) simulation for each of the plurality of circuit inputs; b) performing a MIS simulation in which all of the plurality of inputs switches; c) determining at least one skew window resulting from the SIS simulations; d) determining a maximum MIS penalty from the MIS simulation; and e) creating a delay model from the at least one skew window and maximum MIS penalty.

BRIEF DESCRIPTION OF THE DRAWINGS

The accompanying drawings, which are incorporated in and which constitute part of the specification, illustrate the presently preferred embodiments of the invention which, together with the general description given above and the detailed description of the preferred embodiments given below serve to explain the principles of the invention.

DETAILED DESCRIPTION

Detailed embodiments of the present invention are disclosed herein. However, it is to be understood that the disclosed embodiments are merely illustrative of the invention that may be embodied in various forms. In addition, each of the examples given in connection with the various embodiments of the invention is intended to be illustrative, and not restrictive.

In the following description, and for the illustrative explanations, specific details are set forth in order to provide a thorough understanding of various aspects of the invention. It will be apparent to those skilled in the art that the present invention may be practiced without those specific details. In other instances, well known structures and devices are shown in block diagram to avoid unnecessarily obscuring embodiments of the present invention. Therefore, specific structural and functional details disclosed herein are not to be interpreted as limiting, but merely as a representative basis for teaching one skilled in the art how to variously employ embodiments of the present invention.

Figure 6:
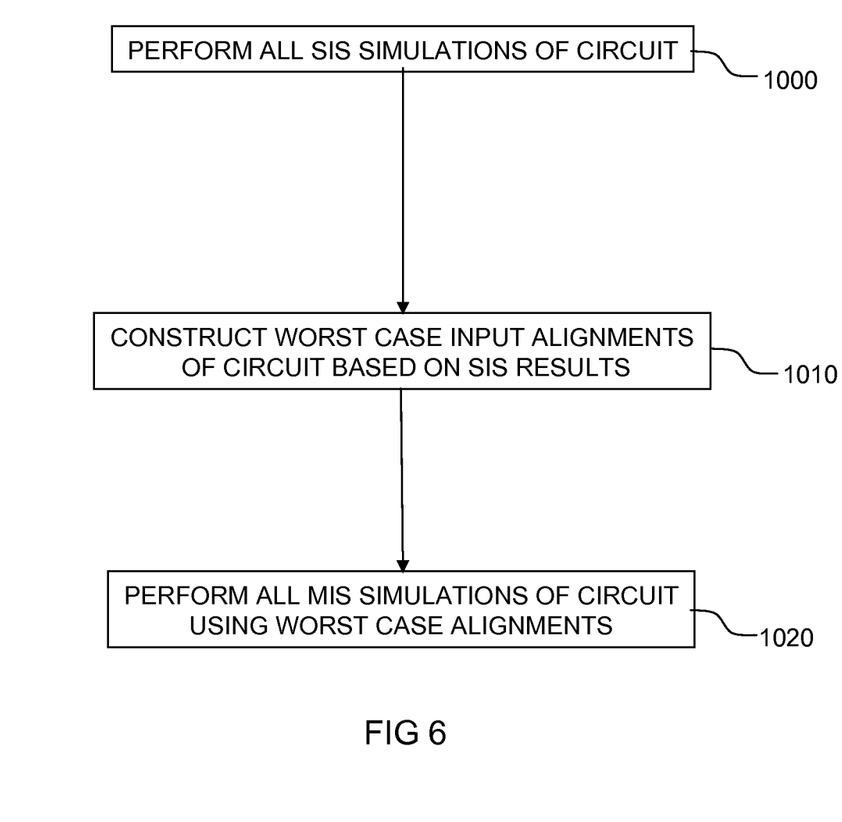
FIG. 6 is a flow chart showing a delay rule construction, in accordance with an embodiment of the invention.

Referring now to FIG. 6, a flow chart of an embodiment of the present invention is shown that illustrates some of the most relevant steps of the delay model construction.

Step 1000: For a circuit for which a delay model is constructed, perform all SIS simulations of the circuit.

Step 1010: For a circuit for which a delay model is constructed, for each MIS simulation to be included in the delay rule, use the SIS delay information to compute the relative start times at the circuit inputs which would cause the output (or internal merge point) to switch at the same time. This set of relative start times is the set of worst case skews between the circuit inputs.

Step 1020: For a circuit for which a delay model is being constructed, perform MIS simulations using the relative input skews calculated in step 1010 and capture the resulting delays, output slews, and other timing information in the delay model.

Figure 7A:
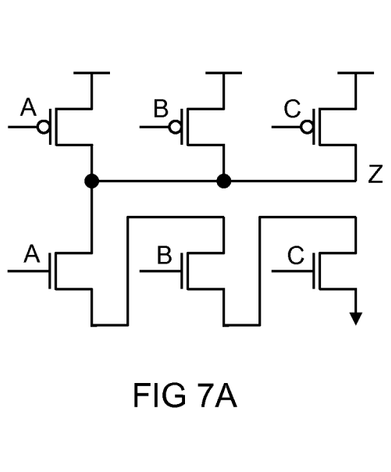
FIGS. 7A-7B illustrate SIS rise to fall simulations for a three input NAND gate.
Figure 7B:
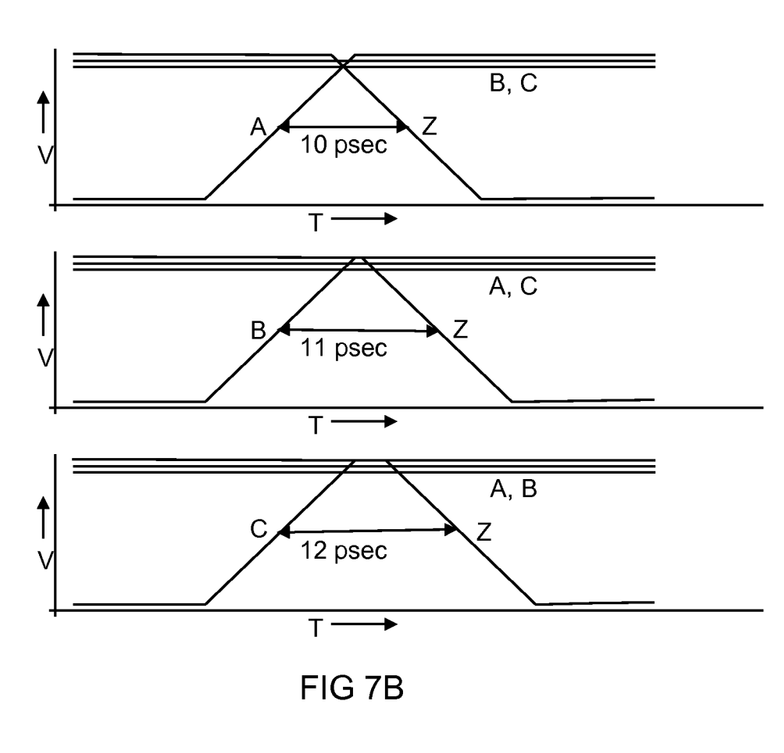

Referring back to step 1000, and with reference to FIG. 7A, an example of a three-inputs NAND gate with inputs A, B, and C and output Z is shown. Referring to FIG. 7B, step 1000 performs SIS simulations wherein it is assumed that the set of these simulations are:

$A$ rising, $B$ high, and $C$ high → $Z$ falling, $A$ high, $B$ rising, and $C$ high → $Z$ falling, and $A$ high, $B$ high, and $C$ rising → $Z$ falling.

Assuming that the SIS delays are, respectively, $A$ rising, $B$ high, and $C$ high → $Z$ falling, 10 psec $A$ high, $B$ rising, and $C$ high → $Z$ falling, and 11 psec $A$ high, $B$ high, and $C$ rising → $Z$ falling 12 psec and assuming that the slews at A, B, C, and Z are all 2 psec.

Assuming that the MIS simulations are:

A rising,B rising, and C high→Z falling,

A rising,B high, and C rising→Z falling,

A high,B rising, and C rising→Z falling, and

A rising,B rising, and C rising→Z falling.

Figure 8:
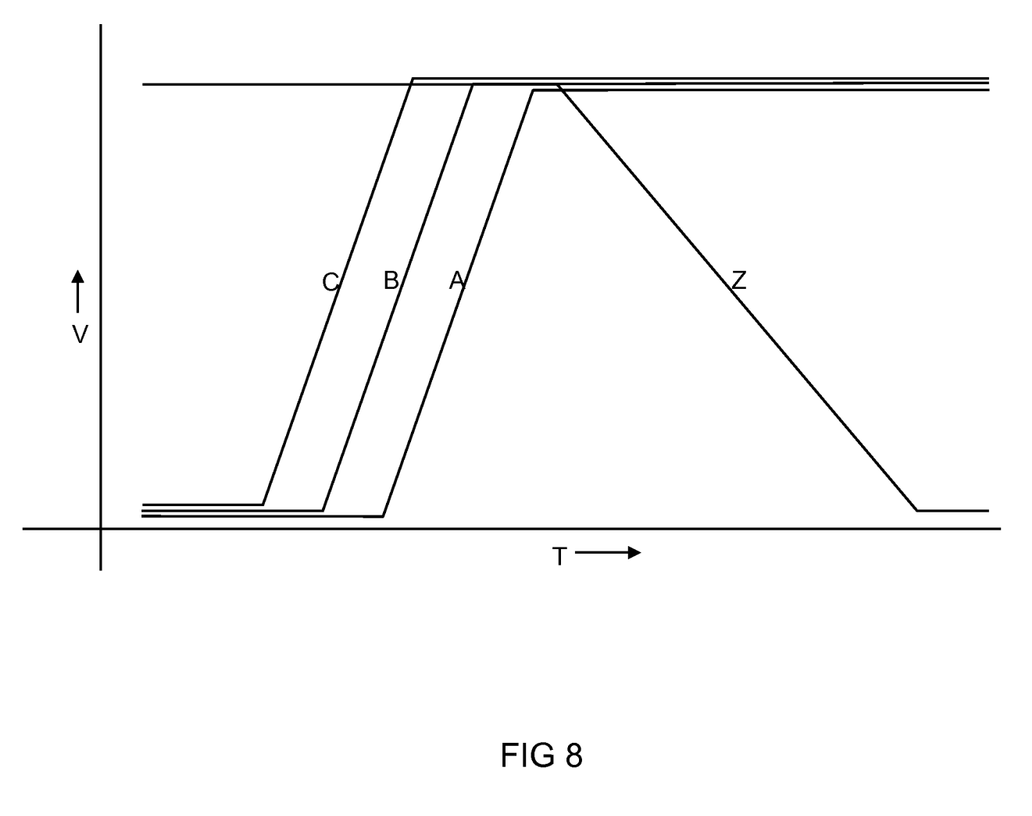
FIG. 8 illustrates the alignment of side input transition times for one MIS simulation for a NAND gate.

In this case, step 1010 will compute the alignment as shown in FIG. 8 for the A rising, B rising, C rising case, with A rising at 2 psec, B rising at 1 psec, and C rising at 0 psec, so as to align the output transitions expected at Z based on the SIS simulation delays. Alternatively, the input switching events may be aligned so that the MIS simulation is performed with zero skew between inputs. In this case, step 1020 will then perform this simulation and capture the simulation results in the delay model. Suppose that for the A to Z pseg, the resulting MIS delays are:

A rising,B rising, and C high→Z falling,15 psec max penalty 5 psec

A rising,B high, and C rising→Z falling, and 15 psec max penalty 5 psec

A rising,B rising, and C rising→Z falling,20 psec max penalty 10 psec

Generally, a number of possible MIS simulations may generate penalties for the same pseg and the same combinations of side inputs switching. For instance, in a more complex circuit, in addition to A rising, B rising, and C high, there may also be a qualitatively different simulation with A rising, B rising, and C low. The delay model stores the worst case of the maximum MIS penalties from the set of simulations with the same inputs switching in the same direction. Output slews are also stored in most delay models and will also be changed by MIS in most cases. Output slews may be obtained from each of the SIS and MIS simulations used to collect delay information, and maximum MIS penalties for slews may be computed in the same way as for delays (as the difference in the output slews from the MIS and SIS simulations) and stored in the delay model.

For CCCs having multiple outputs, one can view each output independently. In other words, one can perform the process described above once for every output of the circuit.

Figure 9:
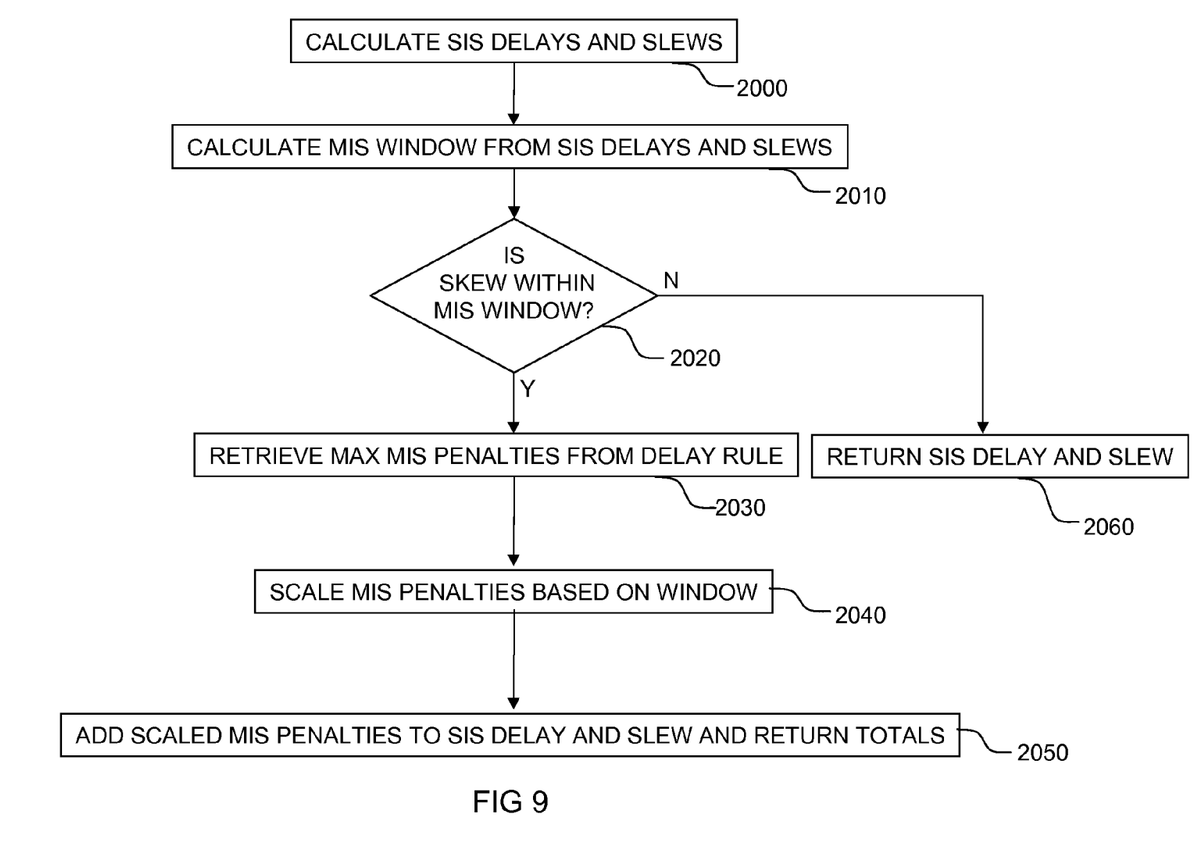
FIG. 9 illustrates the steps of using a delay rule, in accordance with an embodiment of the invention.

Referring now to FIG. 9, a flow chart of the present invention is shown that illustrates some of the most important steps in the use of the delay model constructed previously in steps 1000, 1010, and 1020.

Step 2000: For an instance of a circuit described by the delay model, calculate the SIS delays and output slews for each of the psegs of the model.

Step 2010: For an instance of a circuit described by the delay model, calculate the skew window between each pseg input and each of its switching side inputs for each MIS simulation from the SIS delays, input slews, and SIS output slews.

Step 2020: Calculate the actual skews between inputs for each circuit from the actual ATs at the circuits' inputs, and determine if all of the skews for the switching inputs in an MIS simulation are within the skew windows calculated in step 2010. If one or more of the skews is outside the window, fall back to prior art techniques (step 2060). Otherwise, proceed to step 2030.

Step 2030: Retrieve the maximum delay and output slew MIS penalties stored in the delay rule for the type of circuit, the pseg, and the specific type of the particular MIS simulation.

Step 2040: Determine where in the skew windows the actual skews fall, and scale down the MIS penalty linearly as the edge of the window is approached.

Step 2050: Add the scaled MIS delay and output slew penalties to the SIS delay and output slew, respectively, and return the sum as the delay for the pseg.

Step 2060: If one or more of the skews was found to be outside of the skew window in step 2020, return the SIS delays and output slews as the delays and output slews for the pseg.

Figure 10:
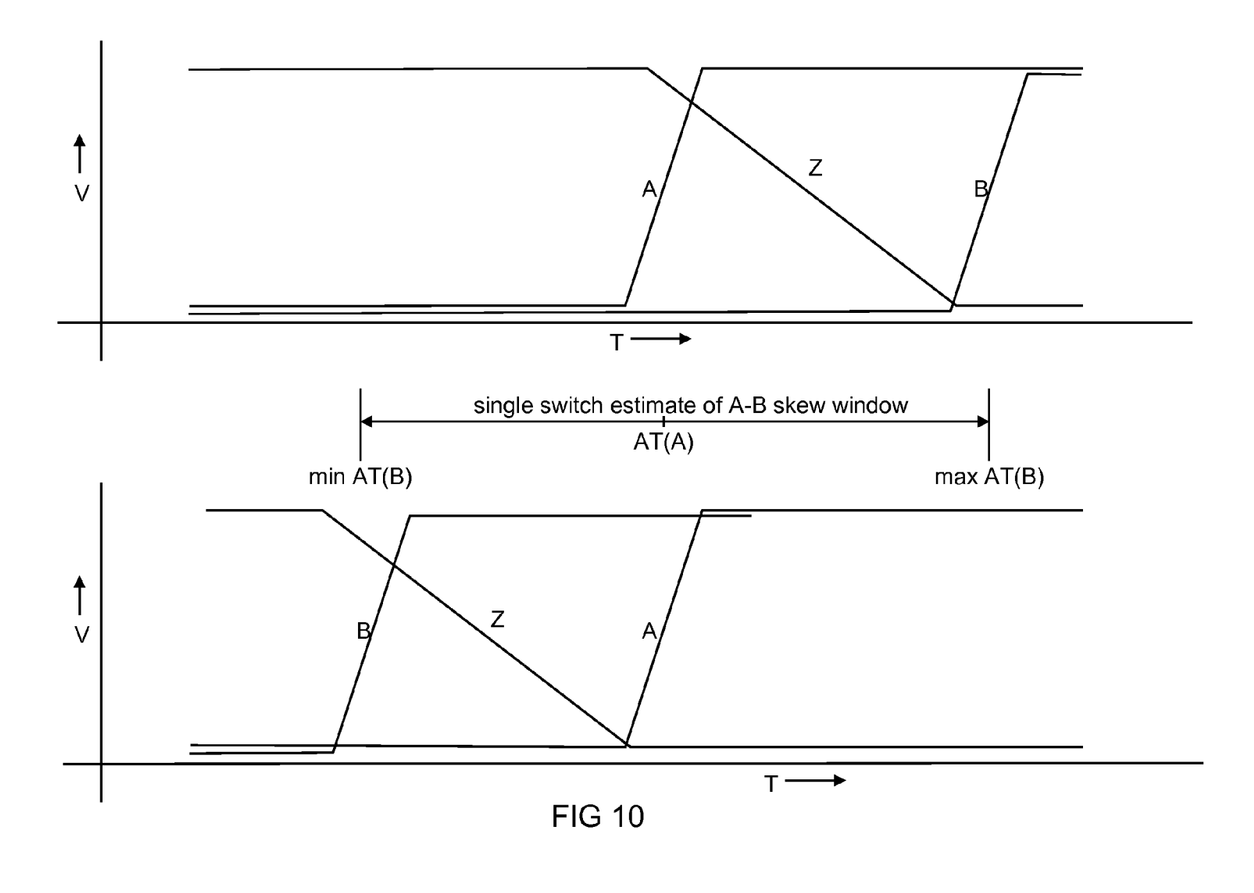
FIG. 10 illustrates a derivation of the skew window from the SIS data.
Figure 11:
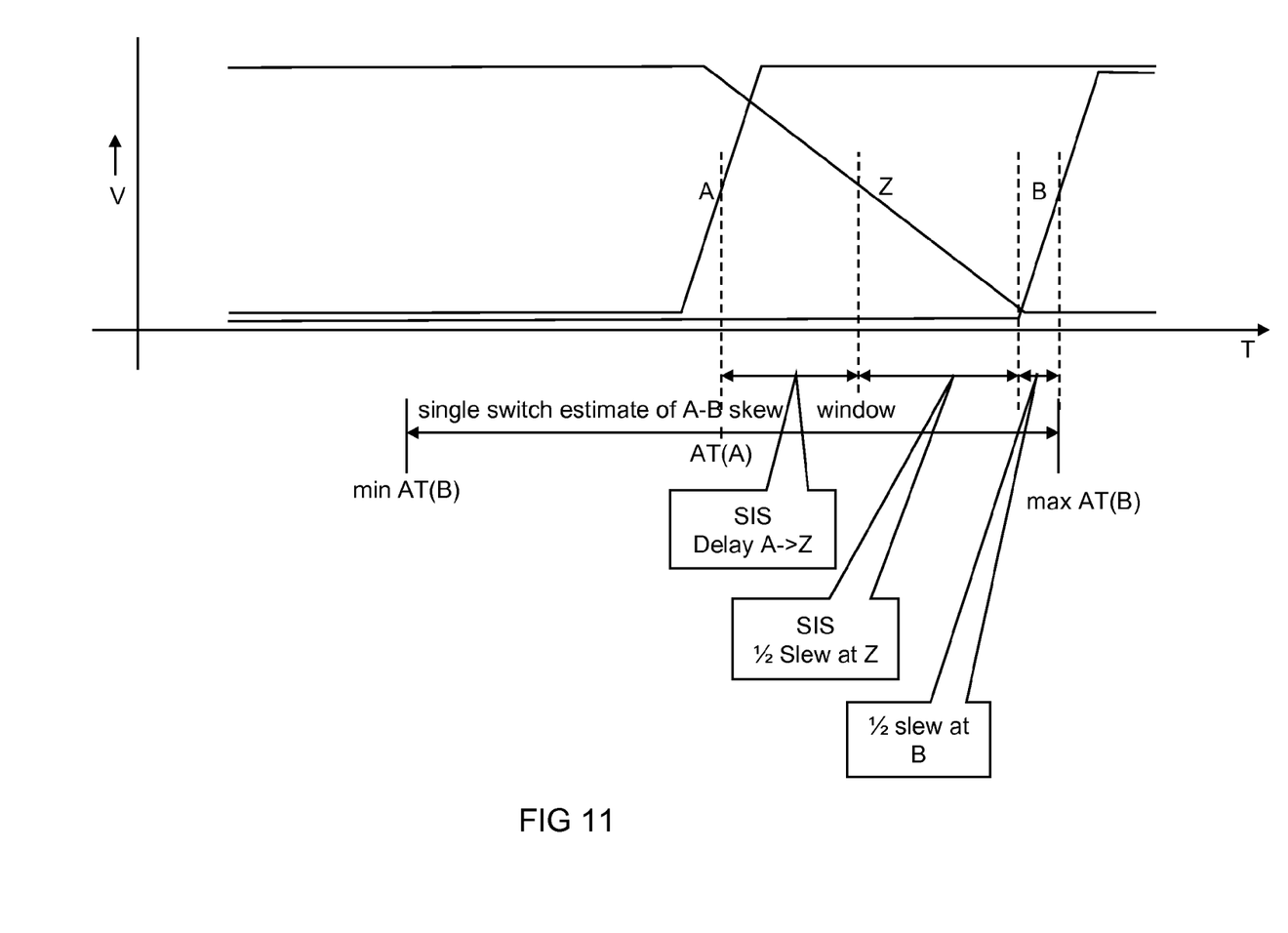
FIG. 11 illustrates the derivation of the skew window from components of the SIS data.

For example, assume that in a late mode analysis, the rising ATs at A, B, and C respectively are 20 psec, 15 psec, and 5 psec. In step 2000 the SIS delays and output slews from A, B, and C to Z are retrieved from the delay model, yielding 10 psec, 11 psec, and 12 psec, as captured earlier (omitting the MIS penalty for now). The skews, the differences in the ATs, from A to B and A to C are therefore 5 psec and 15 psec. In step 2010 the skew windows for pairs of inputs are calculated. The center of the MIS window for a particular pair of inputs is at the AT skew that was used in determining the maximum MIS penalties, i.e., the input skew that, when added to their respective SIS delays, would cause the same AT at the circuit output. The width of the MIS window on each side of the zero skew point is the skew that would be required for the output transition due to the earlier input to complete before the start of the later input transition. Thus, the inequality used to determine whether a particular input skew falls within the MIS skew window (see FIG. 10 and FIG. 11) is:

$$-dlysingle(B\rightarrow Z)-(slew(A)+slewsingle(B-Z))/2<AT(B)-AT(A)<$$

$$dlysingle(A-Z)+(slew(B)+slewsingle(A-Z))/2$$

For inputs A and B with ATs of 20 psec and 15 psec, respectively, this yields (all numbers in psec):

$$-11-(2+2)/2<AT(B)-AT(A)<10+(2+2)/2$$

or $$-13<AT(B)-AT(A)<12$$

Since the skew is actually −5 psec, step 2020 determines that this skew is contained within the skew window and the MIS terms with both A and B rising pass this test. This input skew is then adjusted by the difference between the SIS delays for the two inputs to get the skew for the two input signals after propagation to the output. In this case the output skew is:

$$\text{output skew} = (AT(B) + dlysingle(B \rightarrow Z)) -$$
$$(AT(A) + dlysingle(A \rightarrow Z))$$
$$= (15 + 11) - (20 + 10)$$
$$= -4$$

Because the output skew is negative and a late mode analysis is being performed, the output arrival time is dominated (or determined) by A. More generally, for a skew window between inputs X and Y feeding output Z, with an output skew (AT(X)+dlysingle(X→Z))−(AT(Y)+dlysingle(Y→Z)), the input that dominates is determined as follows:

| Output skew | Analysis mode | Dominating input |
|---|---|---|
| positive | late | X |
| positive | early | Y |
| negative | late | Y |
| negative | early | X |

For inputs A and C the skew window formula yields:

$$-12-(2+2)/2 < AT(C)-AT(A) < 10+(2+2)/2$$

or $$-14 < AT(C)-AT(A) < 12$$

Since the skew is actually −15 psec here, this skew is outside of the skew window and the MIS terms with both A and C rising fail this test at step 2020 and do not contribute to the final delay. In general, for an MIS simulation with N inputs switching, there are N−1 skews between the "from" point of the pseg and the remaining inputs and there are N−1 skew windows, all of which the case must fall within, for the MIS penalty from that simulation to apply.

The surviving MIS simulation penalty on rise to fall delay on the A to Z pseg is

*A* rising,*B* rising, and *C* high→*Z* falling,15 psec max penalty 5 psec

Figure 12:
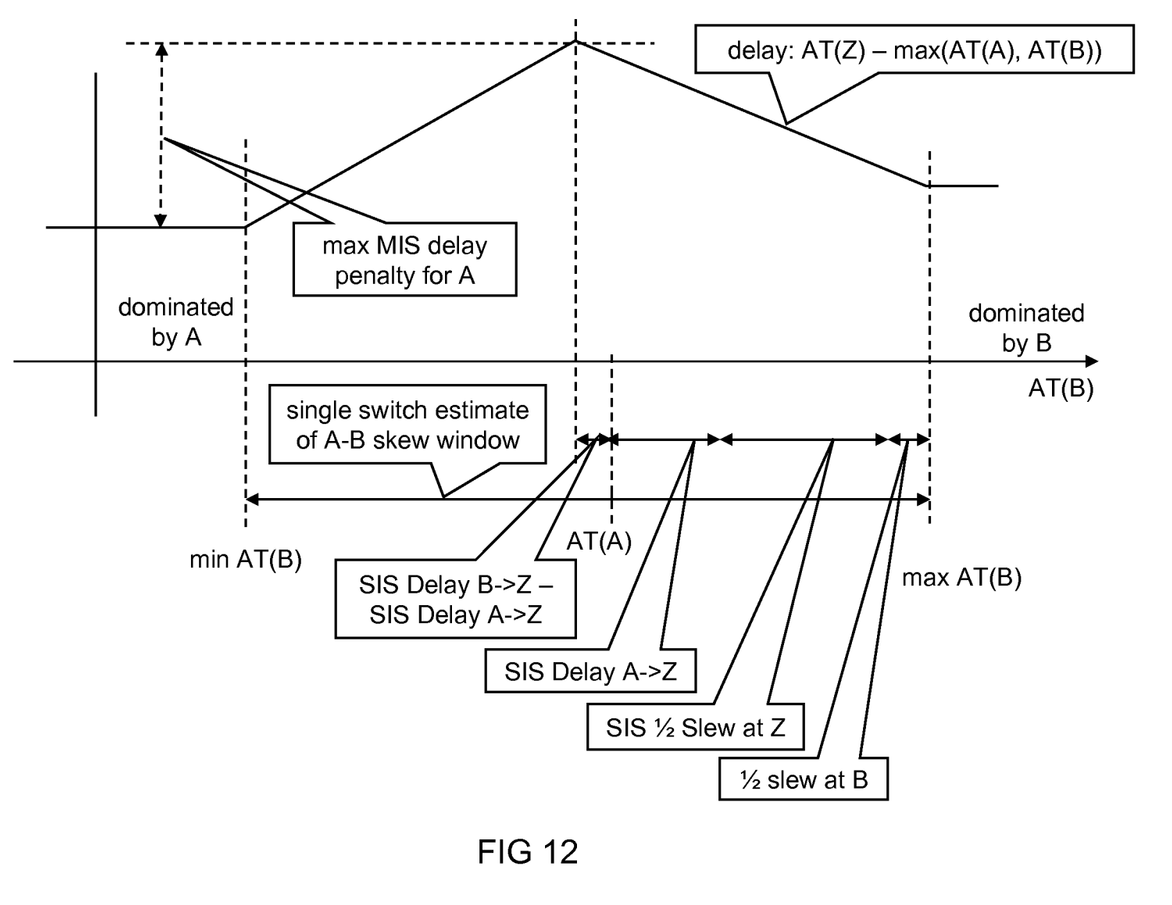
FIG. 12 illustrates scaling the maximum MIS penalty as a function of the position in the skew window.

This maximum MIS penalty is retrieved by step 2030. The entire maximum penalty would be applied when the input skew is the same as that used to determine the maximum MIS penalty, i.e., when the output skew is zero, and ramps down to zero linearly at the boundary of the skew window. In this case the edge of the window is at −13, the skew used to determine the maximum MIS penalty is −1, and the actual skew is −5, so the maximum MIS penalty of 5 psec is scaled in step 2040 by (−13−(−5))/(−13−(−1))=0.667, yielding a final delay, including the scaled MIS penalty, of 10 psec (SIS A→Z delay)+ 0.667*5 psec=13.333 psec. This is summed and returned to STA in step 2050. The scaling of the MIS penalty is also illustrated in FIG. 12. Algebraically, the final delay returned is:

finalDelay=delaySIS+maximumMISPenalty*(maximumSkewAllowedByWindow−actualSkew)/ (maximumSkewAllowedByWindow−skewFor-MaximumMIS)

When computing the delay from an input which has been determined not to dominate at the output, different alternatives are possible. In this situation it is known that the AT of the non-dominating input plus the max MIS delay for that input will still be less (for late mode) or greater (for early mode) than the AT at the output due to some other input. The delay from a non-dominating input can simply be held at the extreme MIS delay, revert immediately back to its SIS delay, or ramp back to its SIS delay for the other side of the window. Different alternatives have different benefits or drawbacks, including ease of implementation and possible discontinuities in the delay function. Generally, a correct AT at the output will be obtained for any delay from a non-dominating input that is not greater than the maximum MIS delay (for late mode) or not less than the minimum MIS delay (for early mode).

More generally, where there are multiple inputs switching in an MIS simulation in addition to the "from" pseg inputs, the final MIS penalty is the maximum MIS penalty for the combination of switching inputs times the product of the scaling factors for each applicable skew window. The scaling factors are:

(maximumSkewAllowedByWindow−actualSkew)/ (maximumSkewAllowedByWindow−skewFor-MaximumMIS)

expressions. For example, if the MIS penalty for the case with A rising, B rising, and C rising had survived the skew testing at step 2020, scaling factors from both the skew between A and B and from the skew between A and C would have been multiplied by this maximum MIS penalty before its addition to the SIS delay. Also, where there are multiple MIS penalties that pass the skew window tests, it is the worst of the surviving scaled penalties that is added to the SIS delay before it is returned.

The delays calculated with these MIS penalties are then used in an ordinary static timing analysis, as is well known in the art, of the subsystem containing the circuit described in the delay model.

The half-multipliers for slews used in calculation of skew windows are based on the assumption of a pure ramp waveform and assume the slew is a measure of the time for the complete transition from 0 to 1 or vice versa. Actual signal waveforms are not perfect ramps, and slew measurements are often made between different points in the signal waveform, e.g., the time taken for the signal to go from 10% to 90% of its final value, or from 20% to 80% of its final value. Some amount of overlap between an output transition due to a transition on a first input and a subsequent transition on a second input may also be considered too small to cause an MIS-induced change in delay. Understanding of the internal paths within the circuit being modeled or the logic threshold of the circuit may also affect the way in which the skew window is determined. Thus all of these factors may alter the ½ slew multiplier or other aspects of the inequality used to determine the MIS skew window. A global scale factor may also be used to expand or contract the computed skew windows to add pessimism or optimism to the analysis or to tune the method to more accurately match actual circuit behavior.

The same skew window and scaling factors used to compute the MIS delay penalty may be used to determine an MIS slew penalty added to the output slew, from maximum MIS slew penalties stored in the delay model.

The present invention can be realized in hardware, software, or a combination of hardware and software. The invention can be realized in a centralized fashion in one computer system or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out these methods.

Computer program means or computer program in the present context mean any expression, in any language, code or notation, of a set of instructions intended to cause a system having an information processing capability to perform a particular function either directly or after conversion to another language, code or notation and/or reproduction in a different material form.

While the present invention has been particularly described in conjunction of a simple illustrative embodiment, it is to be understood that one of ordinary skill in the art can extend and apply this invention in many obvious ways. Other embodiments of the invention can be adapted thereto. It is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A method of generating a delay model for a circuit that models an effect of multiple input switch (MIS) events including a plurality of inputs of the circuit, the method comprising:
   a) using a computer, performing a single input switch (SIS) simulation for each of said plurality of circuit inputs;
   b) performing a MIS simulation in which all of said plurality of inputs switches;
   c) determining at least one skew window, said skew window being a range of skews within which MIS penalties apply, and said determining further comprises computing an SIS delay when calculating a size of said skew windows;
   d) determining a maximum MIS penalty from said MIS simulation; and
   e) creating a delay model from said at least one skew window and maximum MIS penalty.

2. The method of claim 1, wherein step a) further comprises computing SIS delays and output slews for each propagation segment (pseg) of said delay model.

3. The method of claim 1, wherein said effect of MIS events is a difference between an MIS value determined by performing said MIS simulation in step b) and an SIS value determined by performing said SIS simulation in step a).

4. The method of claim 3 wherein said MIS and SIS values are delays.

5. The method of claim 3 wherein said MIS and SIS values are output slews.

6. The method of claim 1 wherein step b) further comprises for said circuit for which said delay model is constructed, performing said MIS simulations using relative input skews capturing resulting delays, output slews, and timing related data corresponding to said delay model.

7. The method of claim 6 further comprising computing said input skews at inputs that are non-simultaneous of said circuit which cause an output or an internal merge point to switch concurrently, said relative input skews becoming worst case skews between said circuit inputs.

8. The method of claim 6, wherein the single MIS simulation aligns switching events at said inputs to said circuit under analysis in order to compute said MIS effect.

9. The method of claim 1, wherein an MIS penalty is applied for any skew within said at least one skew window and eliminated outside said at least one skew window.

10. The method of claim 1 further comprising determining actual input skews for inputs of an instance of said circuit, determining a point within said at least one skew window said actual skews fall, and scaling down said maximum MIS penalty smoothly when approaching an edge of said at least one skew window.

11. The method of claim 10, further comprising summing said scaled MIS penalty to said SIS delay.

12. The method of claim 11, further comprising returning said sum as the delay for said pseg.

13. The method of claim 1, wherein a global scale factor is multiplied by the size of the at least one skew window before use, allowing an additional optimism or pessimism to be added to said delay model.

14. The method of claim 1 further comprising applying to circuits in a macro which are exposed to varying macro primary input's switching arrival times (ATs), while the circuits that are insulated from said ATs are simulated with the fixed skews defined by macro internal circuitry.

15. The method of claim 1 further comprising applying to a circuit library characterization, wherein said delay models generated for each circuit in said library are stored in a model library.

16. The method of claim 1, wherein step c) further comprises computing during delay model construction said at least one skew window from SIS delays, input slews, and SIS output slews.

17. The method of claim 1, further comprising:
   computing actual skews between inputs of an instance of said circuit from actual arrival times at said circuit instance inputs, and
   determining if said actual skews for the switching inputs in an MIS simulation are contained within said at least one skew window.

18. The method of claim 1, further comprising retrieving maximum MIS penalties as a function of circuit type, psegs, and type of said MIS simulation.

19. The method of claim 1 wherein said delay model construction further comprises: performing said SIS simulations of said circuit, and for each of said SIS simulations for which a delay model is constructed, using SIS delay information for each MIS simulation to be included in delay rules.

20. A non-transitory storage device readable by a machine including instructions that, when executed by the machine, perform a method for generating a delay model for a circuit that models an effect of multiple input switch (MIS) events involving a plurality of inputs of the circuit, said method comprising:
   a) performing a single input switch (SIS) simulation for each of a plurality of circuit inputs;
   b) performing a MIS simulation in which all of said plurality of inputs switches;
   c) determining at least one skew window, said skew window being a range of skews within which MIS penalties apply, and said determining further comprises computing an SIS delay when calculating a size of said skew windows;
   d) determining a maximum MIS penalty from the MIS simulation; and
   e) creating a delay model from the at least one skew window and maximum MIS penalty.

* * * * *